US009385234B2

(12) United States Patent
Lee et al.

(10) Patent No.: US 9,385,234 B2
(45) Date of Patent: Jul. 5, 2016

(54) FINFETS WITH STRAINED WELL REGIONS

(71) Applicant: Taiwan Semiconductor Manufacturing Company, Ltd., Hsin-Chu (TW)

(72) Inventors: Yi-Jing Lee, Hsin-Chu (TW); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 7 days.

(21) Appl. No.: 14/506,189

(22) Filed: Oct. 3, 2014

(65) Prior Publication Data
US 2015/0054040 A1   Feb. 26, 2015

Related U.S. Application Data

(63) Continuation-in-part of application No. 13/789,798, filed on Mar. 8, 2013.

(51) Int. Cl.
| H01L 29/78 | (2006.01) |
| H01L 29/66 | (2006.01) |
| H01L 21/8234 | (2006.01) |
| H01L 29/778 | (2006.01) |
| H01L 27/088 | (2006.01) |
| H01L 29/06 | (2006.01) |

(Continued)

(52) U.S. Cl.
CPC ...... *H01L 29/785* (2013.01); *H01L 21/823412* (2013.01); *H01L 21/823431* (2013.01); *H01L 27/0886* (2013.01); *H01L 29/0657* (2013.01); *H01L 29/165* (2013.01); *H01L 29/66431* (2013.01); *H01L 29/66795* (2013.01); *H01L 29/7787* (2013.01); *H01L 29/7789* (2013.01); *H01L 29/432* (2013.01)

(58) Field of Classification Search
None
See application file for complete search history.

(56) References Cited

U.S. PATENT DOCUMENTS

| 5,565,375 A | 10/1996 | Hiser et al. |
| 2003/0001171 A1 | 1/2003 | Banno et al. |

(Continued)

FOREIGN PATENT DOCUMENTS

| DE | 102010038742 | 2/2012 |
| KR | 1020050078145 | 8/2005 |

(Continued)

OTHER PUBLICATIONS

Daembkes, Heinrich, et al., "The n-Channel SiGe/Si Modulation-Doped Field-Effect Transistor," IEEE Transactions on Electron Devices, vol. ED-33, No. 5, May 1986, pp. 633-638.

*Primary Examiner* — Fei Fei Yeung Lopez
(74) *Attorney, Agent, or Firm* — Slater Matsil, LLP

(57) ABSTRACT

A device includes a substrate, insulation regions extending into the substrate, a first semiconductor region between the insulation regions and having a first valence band, and a second semiconductor region over and adjoining the first semiconductor region. The second semiconductor region has a compressive strain and a second valence band higher than the first valence band. The second semiconductor region includes an upper portion higher than top surfaces of the insulation regions to form a semiconductor fin, and a lower portion lower than the top surfaces of the insulation regions. The upper portion and the lower portion are intrinsic. A semiconductor cap adjoins a top surface and sidewalls of the semiconductor fin. The semiconductor cap has a third valence band lower than the second valence band.

20 Claims, 14 Drawing Sheets

(51) Int. Cl.
*H01L 29/165* (2006.01)
*H01L 29/43* (2006.01)

(56) References Cited

U.S. PATENT DOCUMENTS

| | | |
|---|---|---|
| 2003/0178677 A1 | 9/2003 | Clark et al. |
| 2003/0230778 A1* | 12/2003 | Park et al. .................... 257/349 |
| 2004/0256647 A1 | 12/2004 | Lee et al. |
| 2005/0184316 A1 | 8/2005 | Kim et al. |
| 2006/0076625 A1 | 4/2006 | Lee et al. |
| 2010/0163926 A1 | 7/2010 | Hudait et al. |
| 2010/0230658 A1 | 9/2010 | Pillarisetty et al. |
| 2010/0252816 A1 | 10/2010 | Ko et al. |
| 2011/0156006 A1 | 6/2011 | Chui et al. |
| 2012/0025312 A1 | 2/2012 | Scheiper et al. |
| 2012/0091528 A1 | 4/2012 | Chang et al. |
| 2012/0319211 A1* | 12/2012 | van Dal et al. ................ 257/401 |
| 2013/0001591 A1 | 1/2013 | Wu et al. |
| 2013/0056795 A1 | 3/2013 | Wu et al. |
| 2013/0270638 A1 | 10/2013 | Adam et al. |
| 2014/0054547 A1 | 2/2014 | Eneman et al. |
| 2014/0239402 A1 | 8/2014 | Lee et al. |

FOREIGN PATENT DOCUMENTS

| | | |
|---|---|---|
| KR | 1020110052432 | 5/2011 |
| WO | 2007046150 | 4/2007 |

* cited by examiner

US 9,385,234 B2

FINFETS WITH STRAINED WELL REGIONS

PRIORITY CLAIM AND CROSS-REFERENCE

This application relates to the following commonly-assigned U.S. patent application Ser. No. 13/779,015, filed Feb. 27, 2013, and entitled "FinFETs with Strained Well Regions;" and is a continuation-in-part application of the following commonly-assigned U.S. patent application Ser. No. 13/789,798, filed Mar. 8, 2013, and entitled "FinFETs with Strained Well Regions;" which application is hereby incorporated herein by reference.

BACKGROUND

The speed of metal-oxide-semiconductor (MOS) transistors are closely related to the drive currents of the MOS transistors, which are further closely related to the mobility of charges in the channels of the MOS transistors. For example, NMOS transistors have high drive currents when the electron mobility in their channel regions is high, while PMOS transistors have high drive currents when the hole mobility in their channel regions is high. Germanium, silicon germanium, and compound semiconductor materials (referred to as III-V compound semiconductors hereinafter) comprising group III and group V elements are thus good candidates for forming their high electron mobility and/or hole mobility.

Germanium, silicon germanium, and III-V compound semiconductor regions are also promising materials for forming the channel regions of Fin Field-Effect transistors (FinFETs). Methods and structures for further improving the drive currents on the FinFETs are currently being studied.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12 through 22A are cross-sectional views of intermediate stages in the manufacturing of a semiconductor fin and a FinFET in accordance with alternative embodiments;

DETAILED DESCRIPTION

Figure 1:
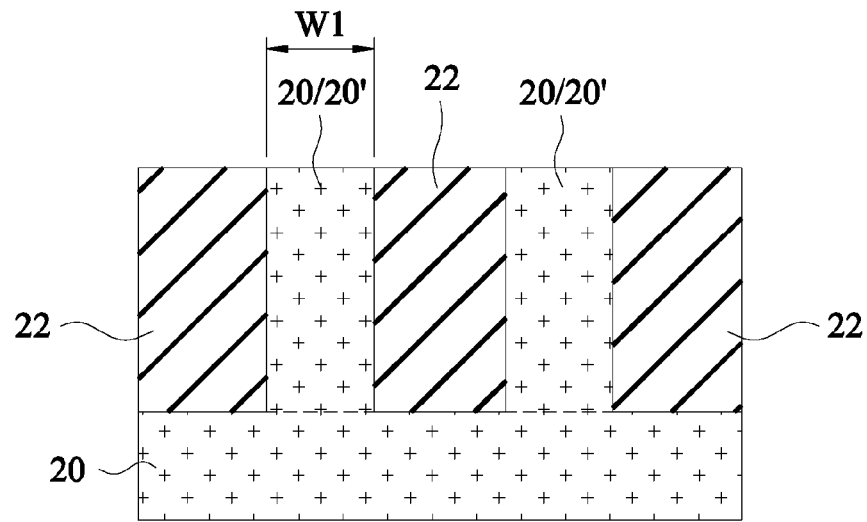
FIGS. 1 through 10C are cross-sectional views of intermediate stages in the manufacturing of a semiconductor fin and a Fin Field-Effect Transistor (FinFET) in accordance with some exemplary embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various exemplary embodiments. The intermediate stages of forming the FinFETs in accordance with some embodiments are illustrated. The variations of the embodiments are discussed. Throughout the various views and illustrative embodiments, like reference numbers are used to designate like elements.

FIGS. 1 through 10C illustrate the cross-sectional views in the formation of an n-type FinFET in accordance with some embodiments of the present disclosure. Referring to FIG. 1, substrate 20 is provided. Substrate 20 may be a semiconductor substrate such as a crystalline silicon substrate. Substrate 20 may also include silicon, germanium, carbon, or the like. Insulation regions such as Shallow Trench Isolation (STI) regions 22 are formed in substrate 20. STI regions 22 may be formed by recessing semiconductor substrate 20 to form trenches, and then filling the trenches with dielectric materials such as silicon oxide. A Chemical Mechanical Polish (CMP) is then performed to remove excess portions of the dielectric materials, and the remaining portions are STI regions 22. The top surfaces of STI regions 22 are thus level with the top surface of substrate 20.

STI regions 22 include neighboring regions having their sidewalls facing each other. Portions 20' of substrate 20 extend between the neighboring STI regions. Width W1 of substrate portions 20' may be between about 10 nm and about 200 nm. It is appreciated that the dimensions recited throughout the description are merely examples, and may be changed to different values. The neighboring STI regions may be separate regions, or may be portions of a continuous region, which may form a STI ring in some embodiments.

Figure 2:
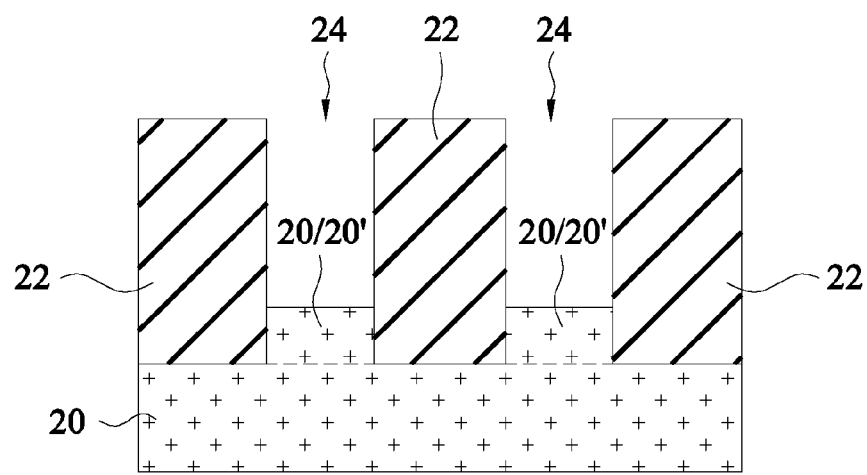

Referring to FIG. 2, substrate portions 20' are recessed, forming recesses 24 between neighboring STI regions 22. In some embodiments, the bottoms of recesses 24 are higher than the bottom surfaces of STI regions 22. In alternative embodiments, the bottoms of recesses 24 are substantially level with or lower than the bottoms of STI regions 22.

Figure 3:
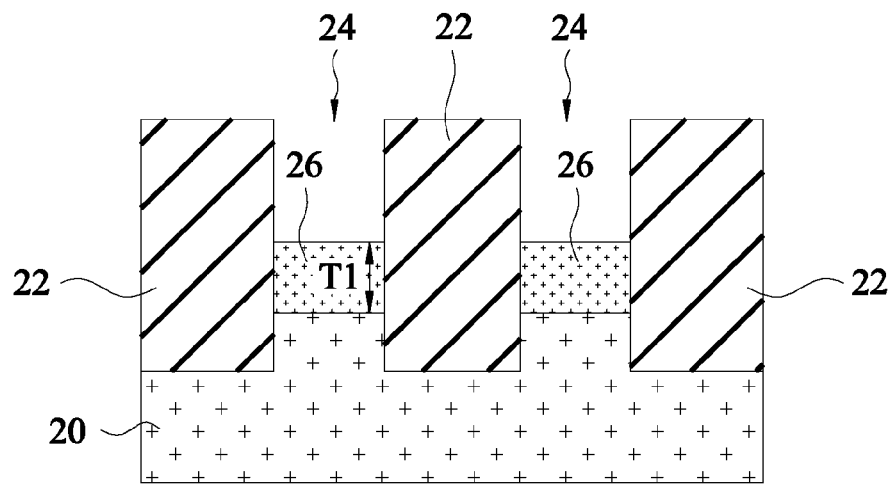
Figure 11:
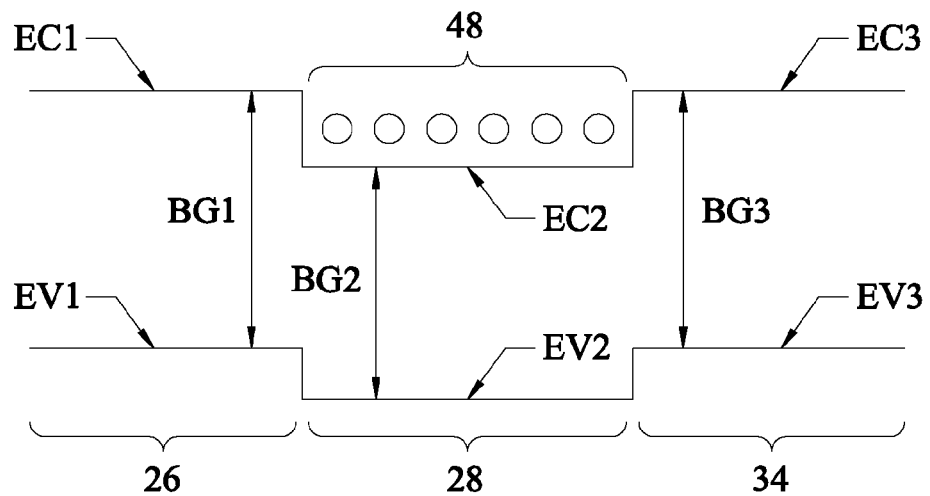
FIG. 11 illustrates a band diagram of a plurality of semiconductor regions in an n-type FinFET.

Referring to FIG. 3, semiconductor regions 26 are grown in recesses 24 through epitaxy. The top surfaces of semiconductor regions are lower than the top surfaces of STI regions 22. Semiconductor regions 26 may have a first lattice constant greater than the lattice constant of substrate 20. In some embodiments, semiconductor regions 26 comprises silicon germanium, which is expressed as $Si_{1-X}Ge_X$, wherein value X is the atomic percentage of germanium in semiconductor regions 26, which atomic percentage may be between about 0.2 (20 percent) and 1 (100 percent) in exemplary embodiments. Semiconductor regions 26 are a relaxed semiconductor region, which means that at least the top portions of semiconductor regions are relaxed with substantially no stress. This may be achieved by, for example, making thickness T1 great enough, since the stresses in upper portions of semiconductor regions 26 are increasingly smaller than the lower portions. In some exemplary embodiments, thickness T1 is greater than about 30 nm, and may be between about 30 nm and about 150 nm. In some exemplary embodiments, the conduction band of semiconductor regions 26 is lower than the conduction band of bulk silicon by between about 0.036 eV and about 0.144 eV, wherein the conduction band of silicon is about 1.1 eV. FIG. 11 schematically illustrates bandgap BG1, conduction band Ec1, and valence band Ev1 of semiconductor regions 26.

Figure 4:
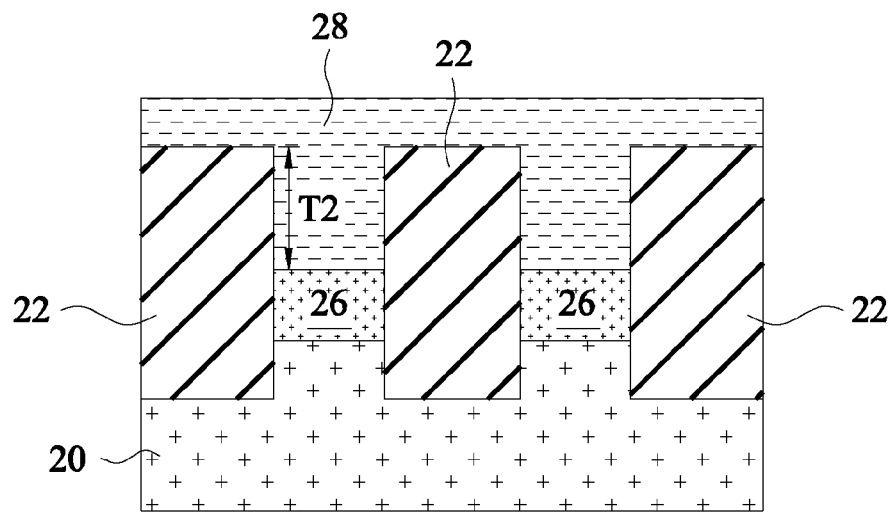

Next, referring to FIG. 4, semiconductor regions 28 are grown in recesses 24 through epitaxy, wherein semiconductor regions 28 are grown over and contacting semiconductor regions 26. Semiconductor regions 28 have a tensile strain, and may be un-doped with n-type and p-type impurities. In some embodiments, the tensile strain is generated by making the lattice constant of semiconductor regions 28 smaller than the lattice constant of semiconductor regions 26. In some embodiments, the tensile strain is higher than about 1.36 MPa, and may be higher than about 6.8 GPa. Semiconductor regions 28 include portions in recesses 24 (FIG. 3), which portions have thickness T2. Thickness T2 is small enough, so that after the subsequent Chemical Mechanical Polish (CMP) in FIG. 5, semiconductor regions 28 are not relaxed and have the tensile strain. In some exemplary embodiments, thickness T2 is smaller than about 150 nm, and may be between about 30 nm and about 150 nm.

FIG. 11 schematically illustrates bandgap BG2, conduction band Ec2, and valence band Ev2 of semiconductor regions 28. Conduction band Ec2 is lower than the conduction band Ec1 of semiconductor regions 26, with the difference (Ec1−Ec2) being greater than about 0.036 eV, for example. In some embodiments, semiconductor regions 28 comprise $Si_{1-y}Ge_y$, wherein value Y is the atomic percentage of germanium in semiconductor regions 28. Value Y may be smaller than about 0.3 (30 percent), and may be between 0 and about 0.3. Value Y may also be equal to 0, which means that semiconductor regions 28 are silicon regions free from germanium. Furthermore, value Y is smaller than value X of semiconductor regions 26, with the difference (X−Y) being greater than about 0.1, greater than about 0.3, or greater than about 0.5, for example. A greater difference (X−Y) may advantageously result in a greater tensile strain in semiconductor regions 28, and a greater conduction band difference (Ec1−Ec2).

Figure 5:
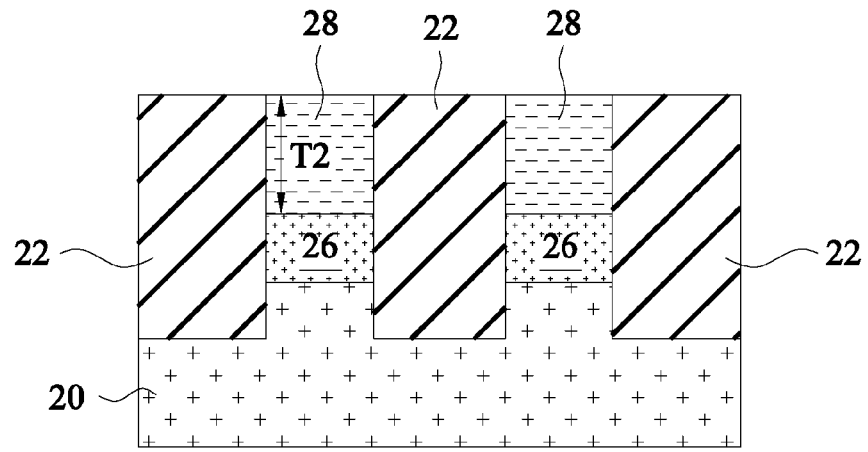

Semiconductor regions 28 may be grown to a level higher than the top surfaces of STI regions 22. A CMP is then performed to level the top surface of STI regions 22 and semiconductor regions 28. The resulting structure is shown in FIG. 5. In alternative embodiments, the growth of semiconductor regions 28 stops at a time when the top surface of semiconductor regions 28 is level with or lower than the top surfaces of STI regions 22. In these embodiments, the CMP may be performed, or may be skipped.

Figure 6:
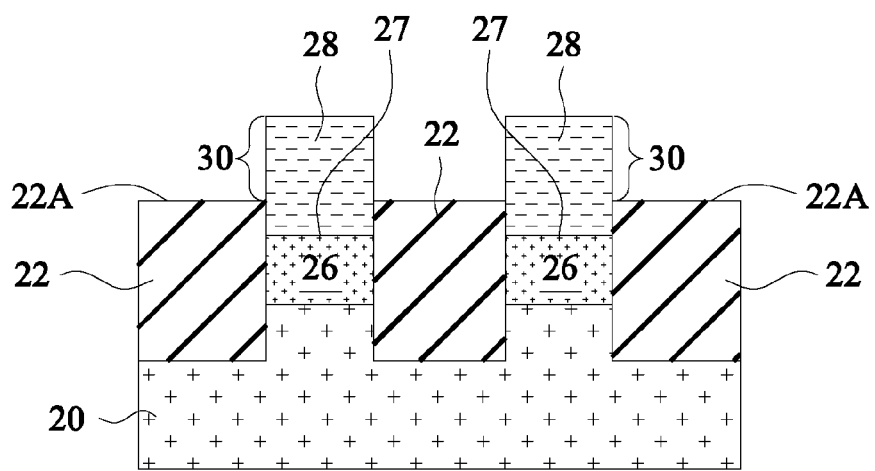

Referring to FIG. 6, STI regions 22 are recessed, for example, through an etching step. The top surfaces 22A of the remaining STI regions 22 are higher than the interfaces 27 between semiconductor regions 26 and semiconductor regions 28. The portions of semiconductor regions 28 that are higher than top surfaces 22A are referred to as semiconductor fins 30 hereinafter.

Figure 7:
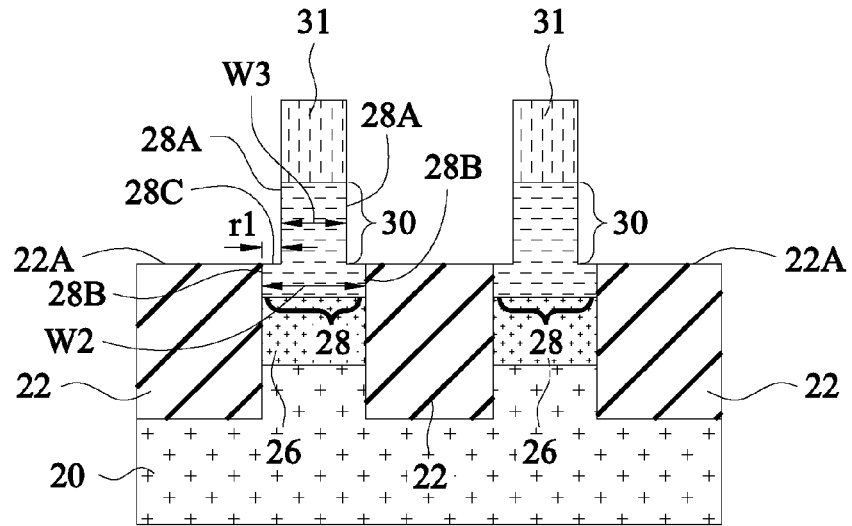

FIG. 7 illustrates the thinning of semiconductor regions 28. In some embodiments, the thinning is performed by applying and patterning photo resist 31, and then using photo resist 31 as a mask to etch semiconductor fins 30. As a result of the thinning, semiconductor regions 28 have lower portions and upper portions narrower than the lower portions. The lower portions have width W2, and the upper portions have width W3, wherein both widths W2 and W3 are measured close to the transition region transiting from the narrow portions to the wide portions. In some embodiments, width W2 is between about 8 nm and about 200 nm, and width W3 is between about 6 nm and about 200 nm. The difference (W2−W3) may be greater than about 2 nm, or greater than about 5 nm, for example. In some exemplary embodiments, an entirety of semiconductor fins 30 is thinned. In alternative embodiments, an upper portion of each of semiconductor fins 30 is thinned, and the lower portion of each of semiconductor fins 30 remains not thinned.

Due to the thinning, the narrow portions of semiconductor regions 28 have sidewalls 28A, and the wide portions of semiconductor regions 28 have sidewalls 28B, which are vertically misaligned to the respective overlying sidewalls 28A. Furthermore, sidewalls 28B are not continuously transitioned to the respective overlying sidewalls 28A. Rather, top surfaces 28C of the wide portions connect sidewalls 28B to the respective overlying sidewalls 28A. Top surface 28C may be substantially flat in some embodiments. Sidewalls 28B and the respective overlying sidewalls 28A may be misaligned by misalignment r1, which may be greater than about 1 nm, or greater than about 5 nm. Top surfaces 28C may be level with the top surface 22A of STI regions 22. Alternatively, although not shown, top surfaces 28C are higher than the top surface 22A of STI regions 22.

Figure 8:
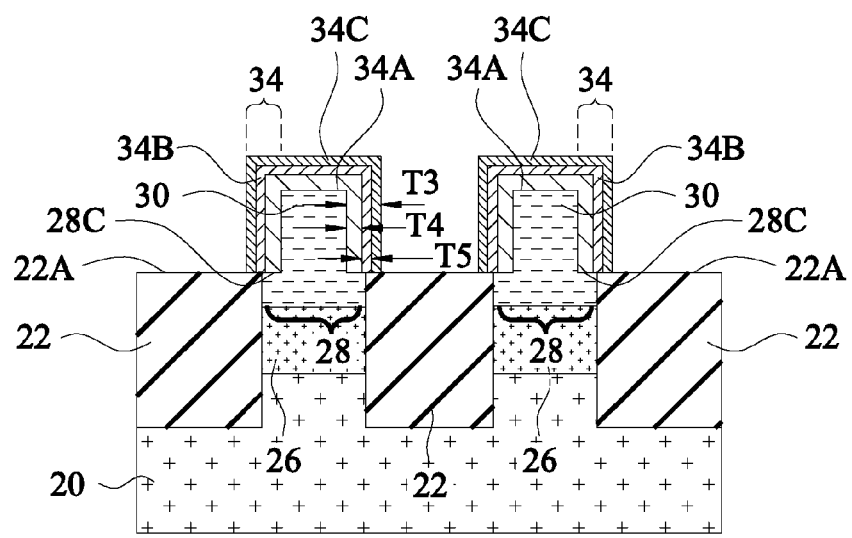

FIG. 8 illustrates the formation of semiconductor regions 34, which are epitaxially grown on the exposed top surfaces and sidewalls of semiconductor fins 30. Semiconductor regions 34 are substantially conformal layers, with the portions on the top surfaces of semiconductor fins 30 having substantially the same thickness T3 as the portions on the sidewalls of semiconductor fins 30. In some embodiments, thickness T3 is between about 5 nm and about 150 nm. Semiconductor regions 34 are in contact with the top surfaces and the sidewalls of the narrow portions of semiconductor regions 28, and in contact with the top surfaces 28C of the wide portions of semiconductor regions 28. In the embodiments that top surfaces 28C are higher than top surfaces 22A of STI regions 22, semiconductor regions 34 are also grown on the sidewalls of the wide portions of semiconductor regions 28.

Bandgap BG3, conduction band Ec3, and valence band Ev3 of semiconductor regions 34 are schematically illustrated in FIG. 11. Conduction band Ec3 is higher than conduction band Ec2 of semiconductor regions 28, with the difference (Ec3−Ec2) being greater than about 0.036 eV, for example. In some embodiments, semiconductor regions 28 comprise $Si_{1-z}Ge_z$, wherein value Z is the atomic percentage of silicon in semiconductor regions 34. Value Z may be greater than about 0.3, and maybe between about 0.3 and 1. Value Z may also be equal to 1, which means that semiconductor regions 34 are pure germanium regions free from silicon. Furthermore, value Z is greater than value Y of semiconductor regions 28, with the difference (Z−Y) being greater than about 0.1, or greater than about 0.3, for example. A greater difference (Z−Y) may advantageously result in a greater conduction band difference (Ec3−Ec2).

Figure 10A:
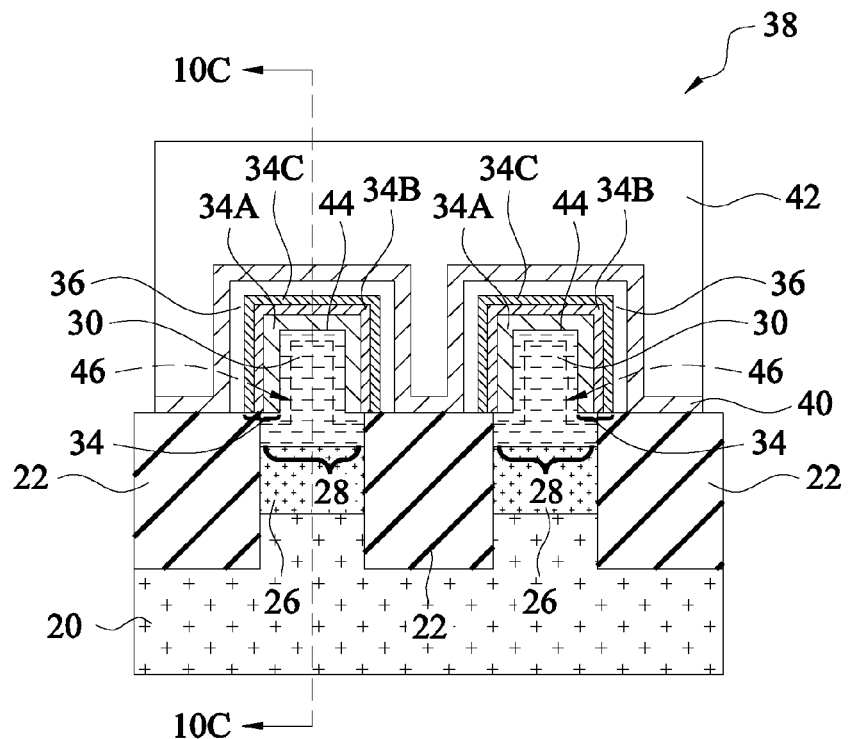
Figure 10B:
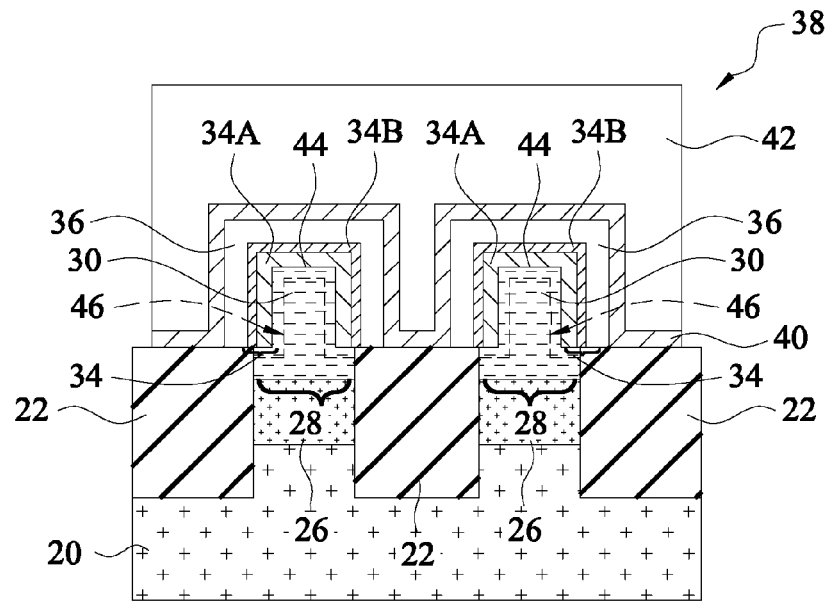
Figure 10C:
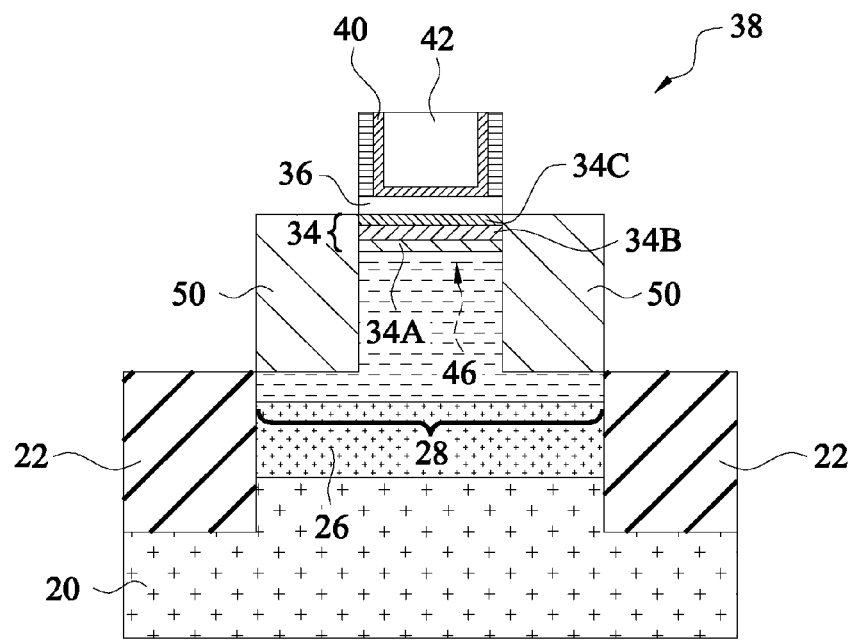

In some embodiments, semiconductor regions 34 include layers 34A and layers 34B, which are formed over layers 34A. Layers 34A and layers 34B may have substantially the same atomic percentage of silicon and substantially the same atomic percentage of germanium, although their compositions may also be different from each other. In some exemplary embodiments, layers 34A are not doped with n-type impurities, and may also be free from p-type impurities. In alternative embodiments, layers 34A are n-type doped layers with the n-type impurity concentration lower than about $10^{16}$/cm$^3$, for example. Thickness T4 of layers 34A may be greater than 0 nm and smaller than about 50 nm. Layers 34B are n-type layers, wherein the n-type impurity concentration in layers 34B may be higher than about $10^{18}$/cm$^3$. In these embodiments, the n-type impurity concentration in layers 34A is lower than the n-type impurity concentration in layers 34B. Layers 34B act as the electron-supply layers for supplying electrons to the underlying carrier channels 46 (FIG. 10A through 10C).

The doped n-type impurity may include phosphorous, arsenic, antimony, or combinations thereof. Layers 34A and layers 34B may be formed in-situ in a same vacuum chamber, and may be formed using essentially the same process conditions, except that in the formation of layers 34A, no n-type dopant is added, while the n-type dopant is added in the formation of layers 34B. Alternatively, in the formation of both layers 34A and 34B, n-type dopants are added, and the n-type dopant amount for forming layers 34A is smaller than that for forming layers 34B. In some embodiments, thickness T5 of doped layers 34B is between about 1 nm and about 20 nm.

In some embodiments, semiconductor regions 34 further include layers 34C over layers 34B. Layers 34C may have atomic percentages of silicon and germanium same as either one, or both, of layers 34A and 34B. In alternative embodiments, the silicon and germanium atomic percentages in layers 34A, 34B, and 34C are all different from each other. Layers 34C may also be un-doped with n-type impurities, or doped with n-type impurities that have a lower impurity concentration than the respective underlying layers 34B. In alternative embodiments, layers 34C are not formed, and the respective structure may be found in FIG. 10B.

Figure 9:
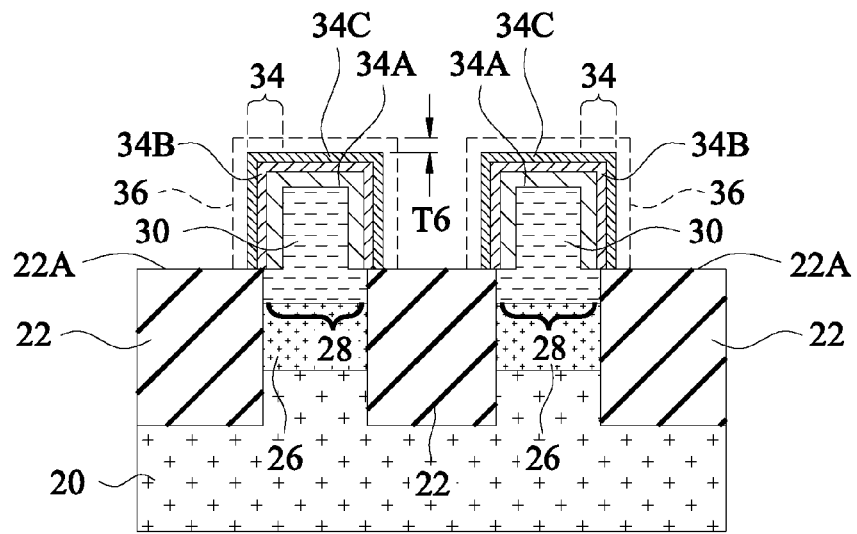

FIG. 9 illustrates the formation of silicon caps 36, which may be substantially pure silicon regions with no germanium added. Silicon caps 36 may also be formed through epitaxy, and hence are over the top portions and sidewall portions of semiconductor regions 34. In some embodiments, no n-type and p-type impurities are added into silicon caps 36, although n-type and p-type impurities with low concentrations, for example, lower than about $10^{16}$/cm$^3$, may also be added. Thickness T6 of silicon caps 36 may be between about 1 nm and about 20 nm in some embodiments. In alternative embodiments, silicon caps 36 are not formed.

The structure shown in FIG. 9 may be used to form FinFET 38, as shown in FIGS. 10A, 10B, and 10C. Referring to FIG. 10A, gate dielectric 40 and gate electrode 42 are formed. Gate dielectric 40 may be formed of a dielectric material such as silicon oxide, silicon nitride, an oxynitride, multi-layers thereof, and/or combinations thereof. Gate dielectric 40 may also be formed of high-k dielectric materials. The exemplary high-k materials may have k values greater than about 4.0, or greater than about 7.0. Gate electrode 42 may be formed of doped polysilicon, metals, metal nitrides, metal silicides, and the like. The bottom ends of gate dielectric 42 may contact the top surfaces of STI regions 22. After the formation of gate dielectric 40 and gate electrode 42, source and drain regions 50 (FIG. 10C) are formed.

As shown in FIG. 10A, semiconductor regions 28 form interfaces 44 with the adjoin semiconductor regions 34. Carrier channels 46, which are alternatively referred to as Two-Dimensional Electron Gas (2DEG) channels, are formed and located in semiconductor regions 28. 2DEG channels 46 may also be close to interfaces 44. Although semiconductor regions 28 may not be doped with n-type impurities, carrier channels 46 still have a high density of electrons, which are supplied by the respective overlying electron-supply layers 34B.

FIG. 10B illustrates a cross-sectional view of FinFET 38 in accordance with alternative embodiments. These embodiments are essentially the same as the embodiments in FIG. 10A, except that the layer 34C in FIG. 10A is not formed. Accordingly, silicon caps 36 are in physical contact with the respective underlying layers 34B.

FIG. 10C illustrates a cross-sectional view of FinFET 38, wherein the cross-sectional view is obtained from the plane crossing line 10C-10C in FIG. 10A. Source and drain regions 50 are formed on the opposite sides of gate dielectric 40 and gate electrode 42. Source and drain regions 50 are doped with an n-type impurity such as phosphorous, arsenic, antimony, or the like, and hence the respective FinFET 38 is an n-type FinFET. 2DEG channel 46 interconnects the source and drain regions 50.

FIG. 11 schematically illustrates a band diagram of semiconductor regions 26, 28, and 34. As shown in FIG. 11, the conduction band Ec2 of semiconductor region 28 is lower than conduction band Ec1 of semiconductor region 26 and conduction band Ec3 of semiconductor region 34. Accordingly, conduction bands Ec1, Ec2, and Ec3 form a well, with conduction band Ec2 forming the bottom of the well. Electrons 48, which are supplied by electron-supply layers 34B (FIGS. 10A and 10B), are confined in the well to form the 2DEG channels. The formation of the well is attributed to that semiconductor region 28 is tensile strained, and hence conduction band Ec2 is suppressed to a level lower than conduction bands Ec1 and Ec3. As a comparison, if semiconductor region 28 is not tensile strained, the conduction band of semiconductor region 28 will be higher than the conduction bands of semiconductor regions 26 and 34, and hence the well region and the 2DEG channel will not be formed. In addition, since semiconductor region 28 may not be doped with impurities, electrons can move freely without collision or with substantially reduced collisions with the impurities.

The above-discussed embodiments of the present disclosure have some advantageous features. In the above-discussed embodiments of the present disclosure, by forming relaxed semiconductor region 26 that has a greater lattice constant than the lattice constant of semiconductor region 28, the overlying semiconductor region 28 may have a tensile strain. The tensile strain results in a conduction band well to be formed in semiconductor region 28. Furthermore, electron-supply layer 34B is formed overlying semiconductor region 28 to supply electrons, which are confined in the well formed in semiconductor region 28 to form the 2DEG channel. Accordingly, the resulting FinFET has a high saturation current.

In addition, in the above-discussed embodiments of the present disclosure, by thinning semiconductor fins, more spaces are provided for forming semiconductor layers on the sidewalls of semiconductor fins. The required chip area occupied by the respective FinFET is hence reduced. The channel width of the respective FinFET, however, is not adversely reduced since the total width of the 2DEG channel is not reduced compared to the scenario that no thinning is performed.

FIGS. 12 through 22A illustrate cross-sectional views of intermediate stages in the formation of a p-type FinFET in accordance with alternative embodiments. Unless specified otherwise, the materials and the formation methods of the components in these embodiments are essentially the same as the like components, which are denoted by like reference numerals in the embodiments shown in FIGS. 1 through 10C. The details regarding the formation process and the materials of the components shown in FIGS. 12 through 22A may thus be found in the discussion of the embodiment shown in FIGS. 1 through 10C.

Figure 12:
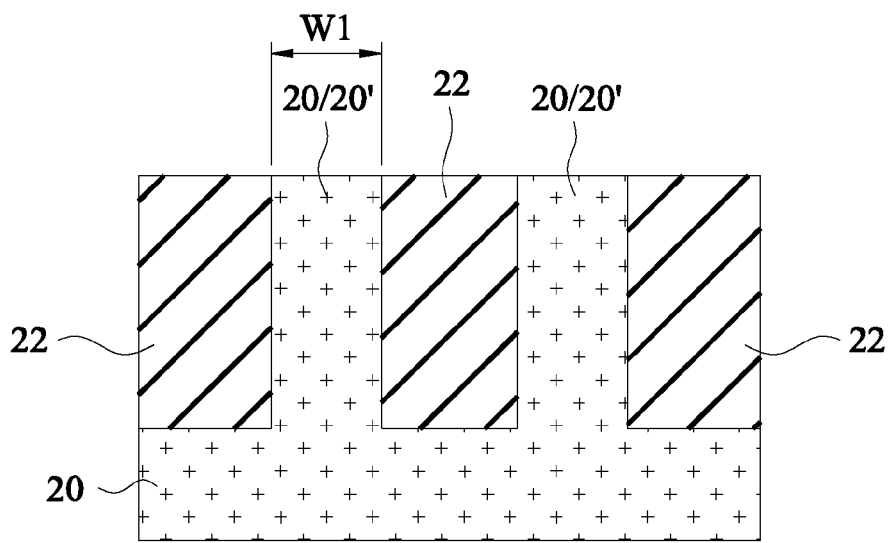

Referring to FIG. 12, substrate 20 is provided, followed by the formation of STI regions 22 in substrate 20. The top surfaces of STI regions 22 are thus coplanar with the top surface of substrate 20. STI regions 22 include neighboring regions having their sidewalls facing each other. Portions 20' of substrate 20 extend between the neighboring STI regions. Width W1 of substrate portions 20' may also be in the range from about 10 nm to about 200 nm. The illustrated neighboring STI regions may be separate regions, or may be portions of a continuous region, which may form a STI ring in some embodiments.

Figure 13:
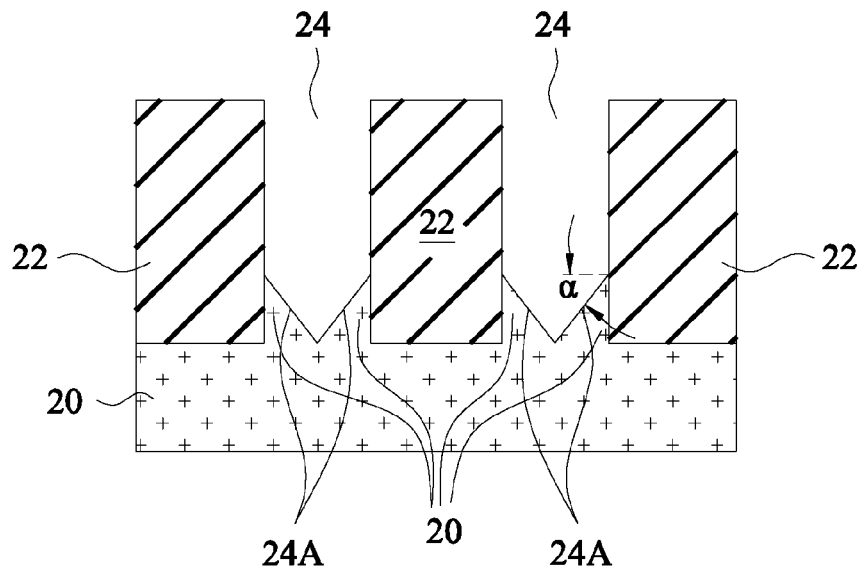

Referring to FIG. 13, substrate portions 20' are recessed, forming recesses 24 between neighboring STI regions 22. In accordance with some embodiments, the bottoms of recesses 24 are higher than the bottom surfaces of STI regions 22. In alternative embodiments, the bottoms of recesses 24 are substantially level with or lower than the bottoms of STI regions 22. The bottom surfaces of recesses 24 may be slanted, with the slant angle α determined by the lattice directions of substrate 20. In accordance with some embodiments, the bottom surfaces of recesses 24 form a V-shape, and slant angle α is about 54.7 degrees. The etching may be performed through wet etching, with KOH solution or tetra methyl ammonium hydroxide (TMAH) solution, for example, used as an etchant. The formation of the V-shaped bottoms of recesses 24 helps the relaxation of the subsequently formed SiGe region in the recesses.

Figure 14:
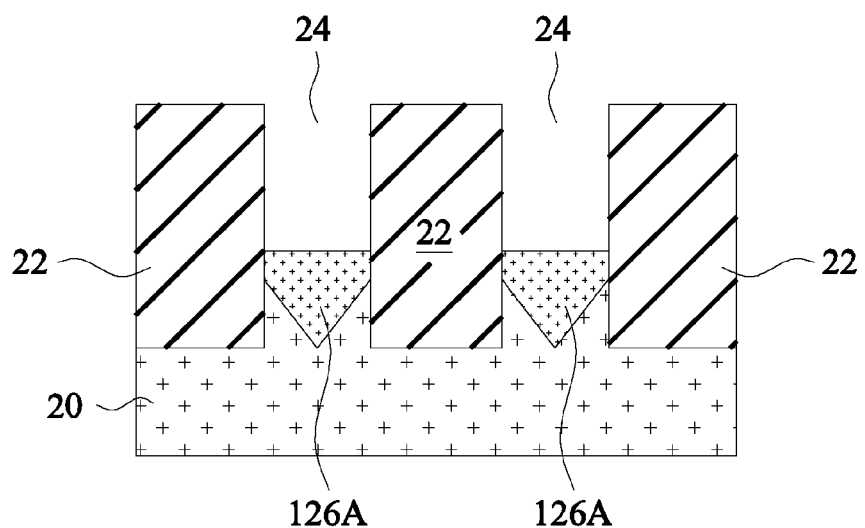

Referring to FIG. 14, semiconductor regions 126A are grown in recesses 24 through epitaxy. The top surfaces of semiconductor regions 126A are lower than the top surfaces of STI regions 22. Semiconductor regions 126A may have a lattice constant greater than the lattice constant of substrate 20. In accordance with some embodiments, semiconductor regions 126A comprise silicon germanium, which is expressed as $Si_{1-x'}Ge_{x'}$, wherein value X' is the atomic percentage of germanium in semiconductor regions 126A, and atomic percentage X' may be between about 0.1 (10 percent) and about 0.5 (50 percent) in exemplary embodiments. Semiconductor regions 126A are intrinsic regions not doped by p-type impurities and n-type impurities. Accordingly, semiconductor regions 126A are intrinsic regions.

Figure 15:
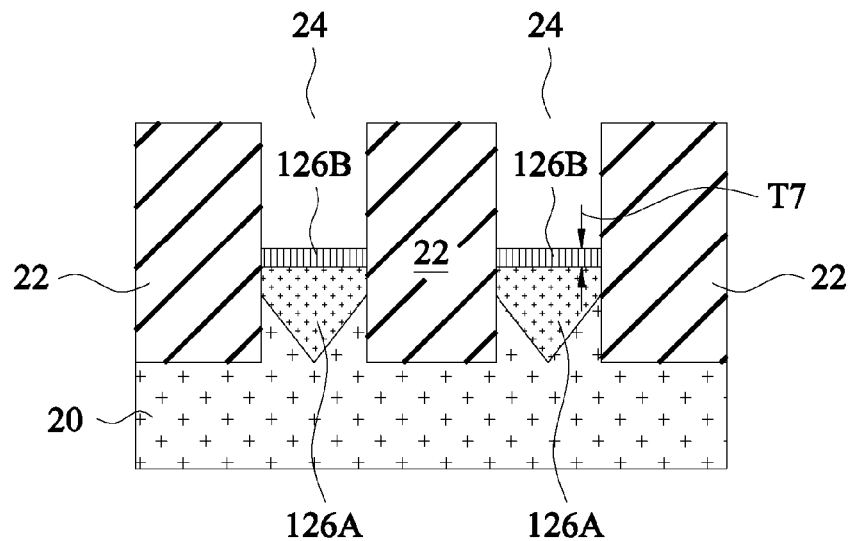

Referring to FIG. 15, semiconductor layers (regions) 126B are grown over semiconductor regions 126A through epitaxy. In accordance with some embodiments, semiconductor layers 126B are formed of SiGe, with the atomic percentage of germanium in semiconductor layers 126B equal to the atomic percentage of germanium in semiconductor regions 126A. In alternative embodiments, the atomic percentage of germanium in semiconductor layers 126B are substantially equal to, but slightly higher than or lower than the atomic percentage of germanium in semiconductor regions 126A. For example, assuming semiconductor layers 126B are formed of $Si_{1-x''}Ge_{x''}$, the absolute value of difference (x"−x') may be smaller than about 0.05.

Semiconductor layers 126B are doped with a p-type impurity such as boron, indium, or the like. The impurity concentration in semiconductor layers 126B may be in the range from about $10^9/cm^3$ to about $10^{20}/cm^3$. The doping of semiconductor layers 126B is performed through in-situ doping with the proceeding of the epitaxy. In accordance with some embodiments, thickness T7 of semiconductor layers 126B is in the range from about 0.5 nm to about 7 nm. Semiconductor layers 126B are used to provide carriers (holes) for the channel regions of the respective FinFET.

Figure 16:
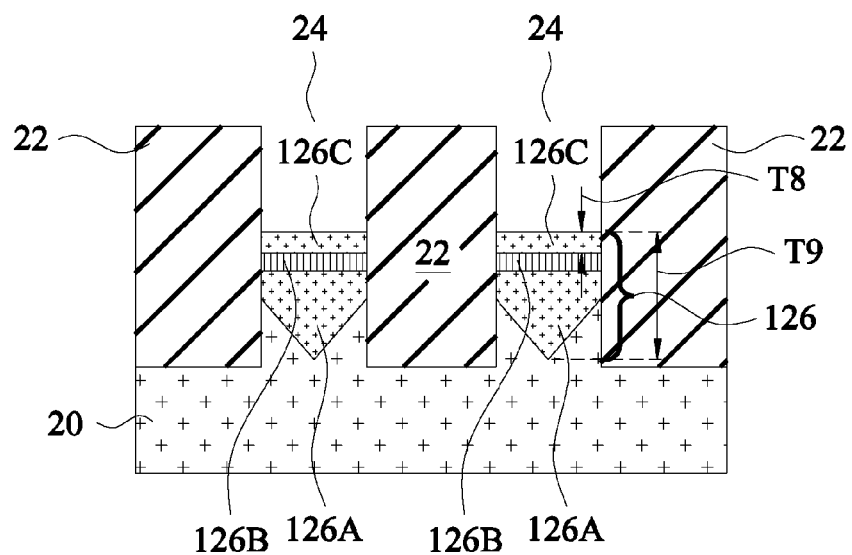

Next, referring to FIG. 16, semiconductor regions 126C are grown over semiconductor regions 126B through epitaxy. In accordance with some embodiments, semiconductor layers 126C are formed of SiGe, with the atomic percentage of germanium in semiconductor layers 126C equal to the atomic percentage of germanium in semiconductor regions 126A and/or 126B. In alternative embodiments, the atomic percentage of germanium in semiconductor layers 126C are substantially equal to, but slightly higher than or lower than the atomic percentage of germanium in semiconductor regions 126A and 126B, for example, assuming semiconductor layers 126C are formed of $Si_{1-x'''}Ge_{x'''}$, the absolute values of differences (x'''−x') and (x'''−x") may be smaller than about 0.05. In some exemplary embodiments, thickness T8 of semiconductor regions 126C is in the range from about 30 nm to about 50 nm. Semiconductor regions 126C are also intrinsic regions not doped by p-type impurities and not doped by n-type impurities. Accordingly, semiconductor regions 126C are intrinsic regions.

Throughout the description, semiconductor regions 126A, 126B, and 126C are in combination referred to as semiconductor buffers 126. The formation of semiconductor regions 126A, 126B, and 126C are accordingly referred to as a first stage, a second stage, and a third stage for forming Semiconductor buffers. The formation of semiconductor regions 126A, 126B, and 126C may be in-situ performed using similar process conditions, except that in the formation of semiconductor regions 126A and 126C, no p-type and n-type impurity is added, while in the formation of semiconductor regions 126B, a p-type impurity (but no n-type impurity) is added. Semiconductor regions 126 are relaxed semiconductor regions, wherein at least the top portions of semiconductor regions are relaxed with substantially no stress, and their lattice constant are not reduced due to stress. The relaxation may be achieved, for example, by making thickness T9 of semiconductor buffers 126 to greater than a threshold thickness for the relaxation to occur. In some exemplary embodiments, thickness T9 is greater than about 50 nm, and may be between about 50 nm and about 150 nm, depending on the germanium percentage in semiconductor buffers 126. The higher the germanium percentage is, the greater thickness is needed for relaxation to occur.

Figure 17:
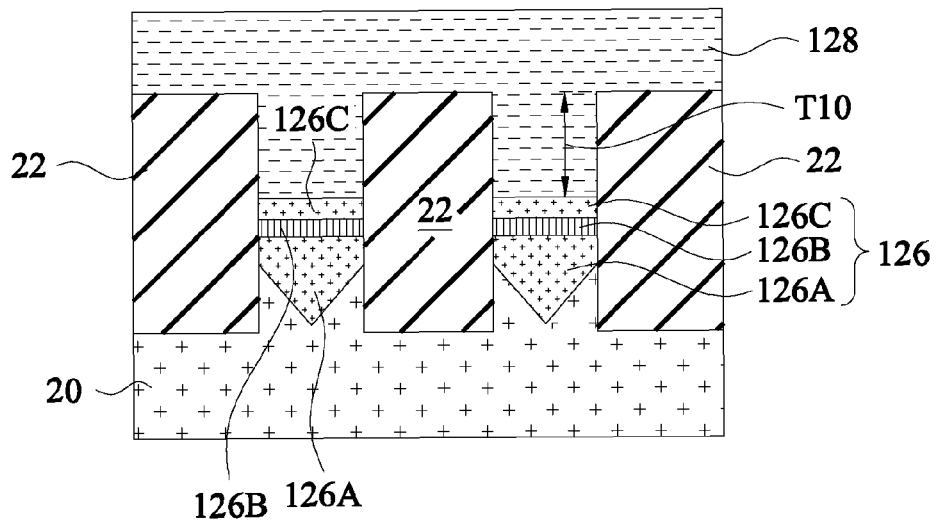
Figure 18:
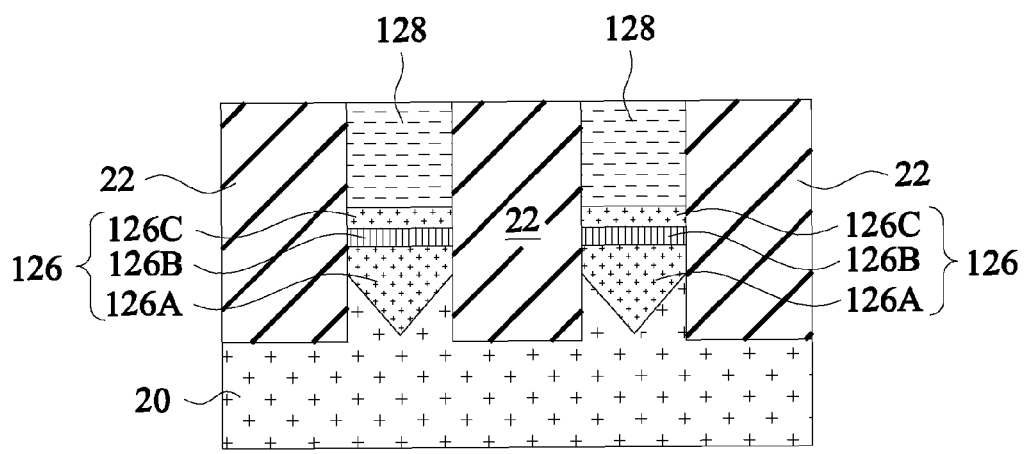

Next, referring to FIG. 17, semiconductor region(s) 128 are grown in remaining recesses 24 (FIG. 16) through epitaxy, wherein semiconductor regions 128 are grown over and contacting semiconductor buffers 126. Semiconductor regions 128 have a compressive strain, and are un-doped with n-type and p-type impurities. Accordingly, semiconductor regions 128 are intrinsic regions. In some embodiments, the compressive strain is generated by making the lattice constant of semiconductor regions 128 greater than the lattice constant of semiconductor buffers 126. Semiconductor regions 128 include portions in recesses 24 (FIG. 16), which portions have thickness T10. Thickness T10 is small enough, so that after the subsequent CMP as shown in FIG. 18, semiconductor regions 128 are not relaxed and have the compressive strain. In some exemplary embodiments, thickness T10 is smaller than about 150 nm, and may be between about 30 nm and about 150 nm.

Semiconductor regions 128 are grown to a level higher than the top surfaces of STI regions 22. A CMP is then performed to level the top surface of STI regions 22 and semiconductor regions 128. The resulting structure is shown in FIG. 18.

In some embodiments, semiconductor regions 128 comprise germanium and are free from silicon. In alternative embodiments, semiconductor regions 128 comprise silicon germanium, which is expressed as $Si_{1-y''}Ge_{y''}$, wherein value Y' is the atomic percentage of germanium in semiconductor regions 128, which atomic percentage may be between about 0.3 (30 percent) and 1.0 (100 percent) in some exemplary embodiments. Furthermore, the germanium atomic percentage Y' of semiconductor regions 128 is higher than the germanium atomic percentage X' (and X" and X''') of semiconductor buffers 126. The difference (Y'−X') (or (Y'−X") and (Y'−X')) may be in the range between about 0.2 and about 0.5.

Figure 19:
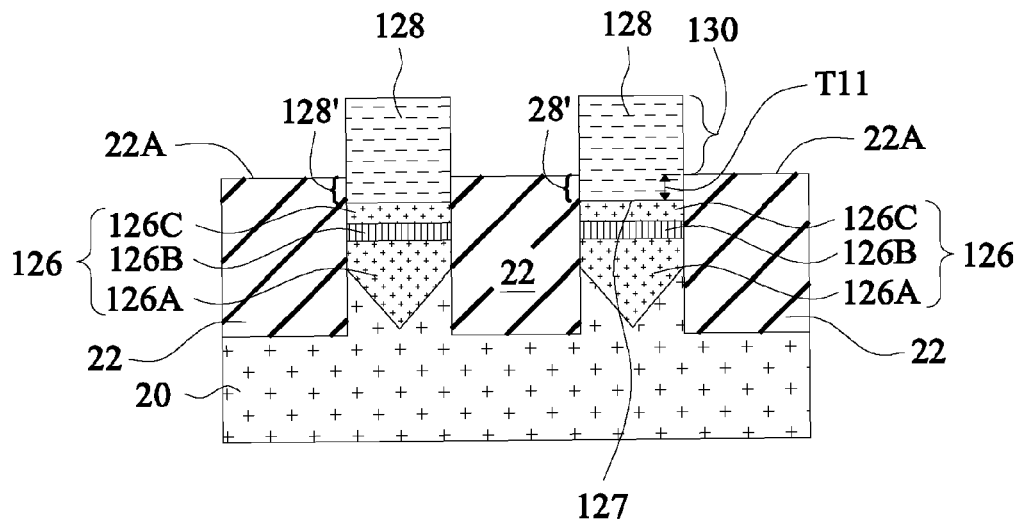

Referring to FIG. 19, STI regions 22 are recessed, for example, through an etching step. The top surfaces 22A of the remaining STI regions 22 are higher than the interfaces 127 between semiconductor buffers 126 and semiconductor regions 128. The portions of semiconductor regions 128 that are higher than top surfaces 22A are referred to as semiconductor fins 130 hereinafter. Semiconductor regions 128 have portions 128' lower than the top surfaces 22A of STI regions 22. Portions 128' have thickness (height) T11. Thickness T11 is desirably in a range not too large and not too small. If thickness T11 is too large, the underlying semiconductor regions 126B cannot provide effective provide carriers (holes) to the channel of the respective FinFET. If thickness T11 is too small, there will be a strong carrier scattering effect will be two strong, and the mobility of the carriers in the channels will be adversely affected. In some embodiments, thickness T11 is in the range between about 5 nm and about 20 nm.

Figure 20:
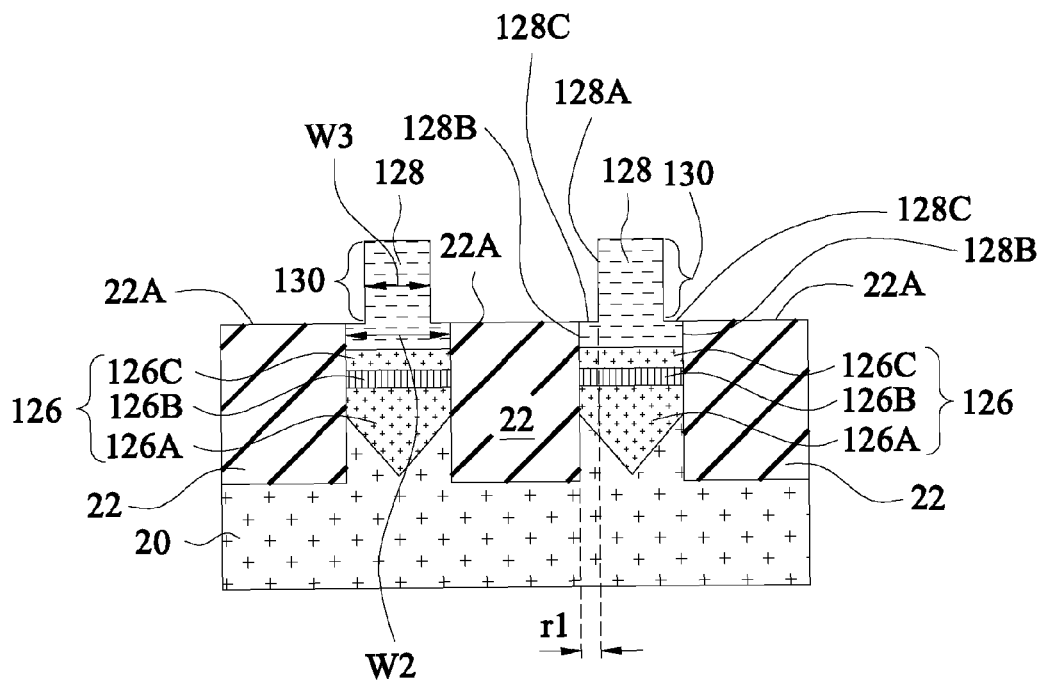

FIG. 20 illustrates the thinning of semiconductor fins 130 in accordance with some embodiments. In alternative embodiments, no thinning is performed. The thinning may be performed by applying and patterning a photo resist (not shown), and then using the photo resist as a mask to etch semiconductor fins 130. As a result of the thinning, semiconductor regions 128 have lower portions and upper portions narrower than the lower portions. The lower portions have width W2, and the upper portions have width W3, wherein both widths W2 and W3 are measured close to the transition region transiting from the narrow portions to the wide portions. In some embodiments, width W2 is between about 8 nm and about 200 nm, and width W3 is between about 6 nm and about 200 nm. The difference (W2−W3) may be greater than about 2 nm, or greater than about 5 nm, for example. In some exemplary embodiments, an entirety of semiconductor fins 130 is thinned.

Due to the thinning, the narrow portions of semiconductor regions 128 have sidewalls 128A, and the wide portions of semiconductor regions 128 have sidewalls 128B, which are vertically misaligned with the respective overlying sidewalls 128A. Furthermore, sidewalls 128B are not continuously connected to the respective overlying sidewalls 128A. Rather, top surfaces 128C of the wide portions connect sidewalls 128B to the respective overlying sidewalls 128A. Top surfaces 128C may be substantially flat or moderately slanted in some embodiments. Sidewalls 128B and the respective overlying sidewalls 128A may be misaligned by misalignment r1, which may be greater than about 1 nm, or greater than about 5 nm. Top surfaces 128C may be level with the top surface 22A of STI regions 22. Alternatively, although not shown, top surfaces 128C are higher than the top surface 22A of STI regions 22.

Figure 21:
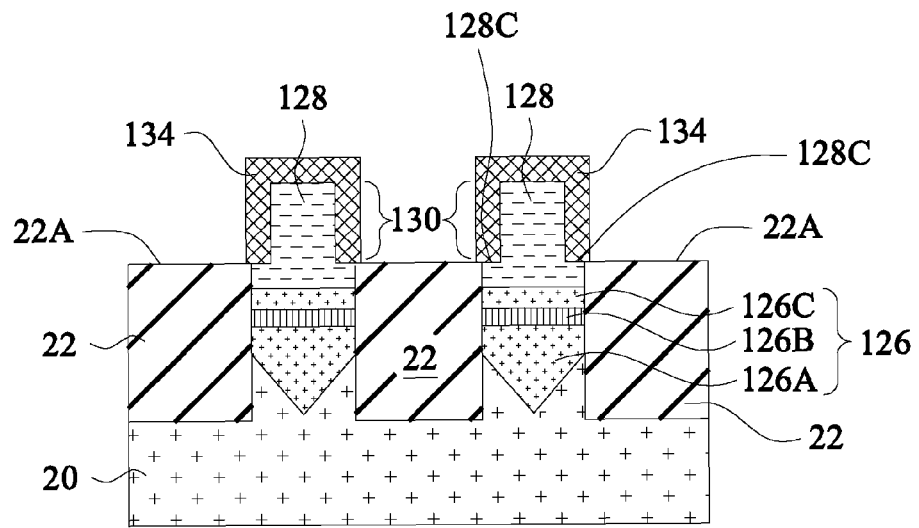

FIG. 21 illustrates the formation of semiconductor caps 134, which are epitaxially grown on the exposed top surfaces and sidewalls of semiconductor fins 130. Semiconductor caps 134 are substantially conformal layers, with the portions on the top surfaces of semiconductor fins 130 having substantially the same thickness as the portions on the sidewalls of semiconductor fins 130. Semiconductor caps 134 are thin caps, for example, with thicknesses in the range from about 1 nm to about 2 nm. Semiconductor caps 134 are in contact with the top surfaces and the sidewalls of the narrow portions of semiconductor regions 128, and in contact with top surfaces 128C of the wide portions of semiconductor regions 128. In the embodiments that top surfaces 128C are higher than top surfaces 22A of STI regions 22, semiconductor caps 134 are also grown on the sidewalls of the wide portions of semiconductor regions 128. Semiconductor caps 134 are not doped by p-type impurities and not doped by n-type impurities. Accordingly, semiconductor caps 134 are intrinsic regions.

Semiconductor caps 134 may be silicon caps free from germanium, or may be silicon germanium caps. In some embodiments, semiconductor caps 134 comprise $Si_{1-z'}Ge_{z'}$, wherein value Z' is the atomic percentage of germanium in semiconductor regions 128, which atomic percentage may be between 0 (wherein semiconductor caps 134 are comprises silicon free from germanium) and about 0.75 (75 percent) in some exemplary embodiments. Furthermore, germanium atomic percentage Z' of semiconductor caps 134 is lower than the germanium atomic percentage Y' of semiconductor regions 128. The difference (Y'−Z') may be in the range between about 0.2 and about 1.0.

Figure 22A:
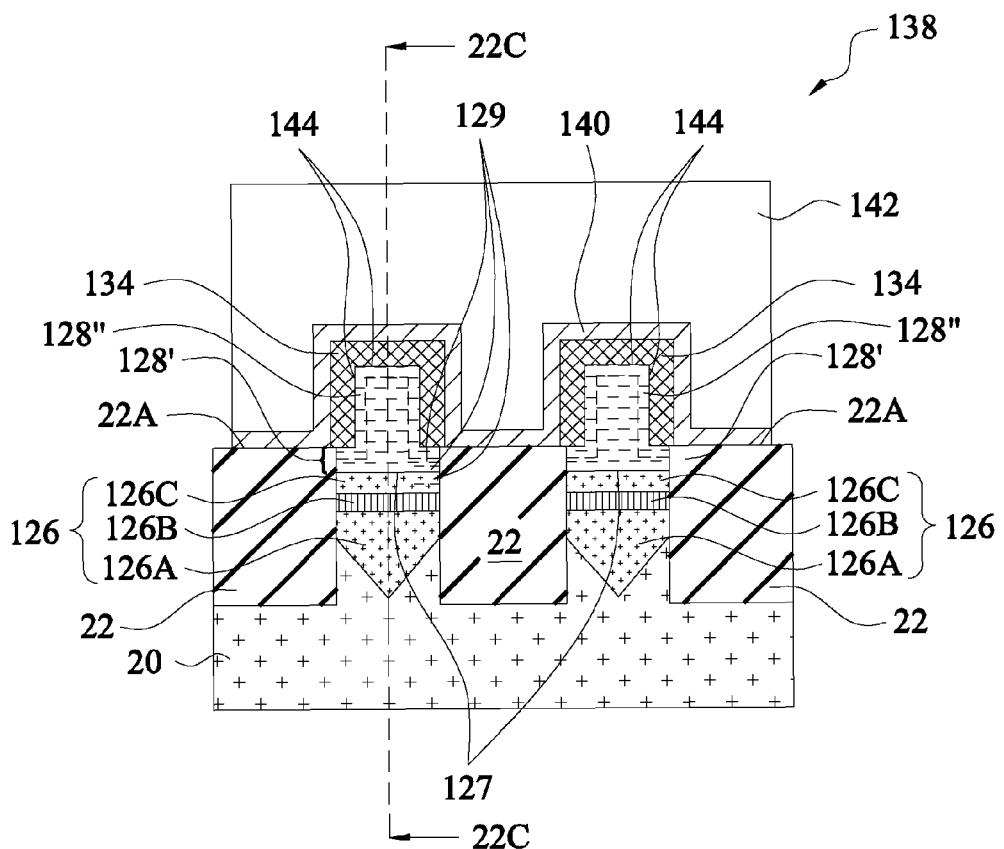

The structure shown in FIG. 21 may be used to form FinFET 138, as shown in FIG. 22A. Gate dielectric 140 and gate electrode 142 are formed. Gate dielectric 140 may be formed of a dielectric material such as silicon oxide, silicon nitride, an oxynitride, multi-layers thereof, and/or combinations thereof. Gate dielectric 140 may also be formed of high-k dielectric materials. The exemplary high-k materials may have k values greater than about 4.0, or greater than about 7.0. Gate electrode 142 may be formed of doped polysilicon, metals, metal nitrides, metal silicides, and the like. The bottom ends of gate dielectric 140 may contact the top surfaces of STI regions 22. After the formation of gate dielectric 140 and gate electrode 142, source and drain regions 150 (FIG. 22C) are formed.

As shown in FIG. 22A, semiconductor regions 128 form interfaces 144 with the adjoining semiconductor caps 134. Furthermore, both semiconductor regions 126 and semiconductor caps 134 have bandgaps higher than the bandgap of semiconductor region 128. Accordingly, a quantum well is formed in semiconductor regions 128. When gate electrode 142 is applied with a low voltage, carriers (holes) are supplied by the doped semiconductor regions 126B, so that the portions 128'' of semiconductor regions 128 become p-type, and act as the channel regions. FinFET 138 is thus turned on. On the other hand, when gate electrode 142 is applied with a high voltage, portions 128'' are intrinsic, and FinFET 138 is turned off.

Furthermore, although semiconductor regions 126A and 126C are intrinsic when grown, in subsequent thermal processes, the p-type impurity in semiconductor regions 126B may be diffused into semiconductor regions 126A and 126C. In accordance with some embodiments, after the diffusion (for example, at the time when FinFET 138 is used and powered on), a lower portion or an entirety of semiconductor regions 126C may become p-type due to the diffusion. The portions 128' of semiconductor regions 128 underlying top surfaces 22A of STI regions 22, however, include at least top portions remaining to be intrinsic. Lines 129 schematically illustrate the possible upper limit of the diffused p-type impurity, wherein lines 129 also illustrate the possible positions of the interfaces between the diffused p-type regions and the remaining intrinsic regions. Positions 129 may be leveled with, higher than, or lower than interfaces 127. Positions 129, however, will be lower than the top surface 22A of STI regions 22, with the height difference between top surface 22A and the top surfaces of the diffused p-type regions in the range from about 5 nm and about 50 nm, for example. As a result of the diffusion, the locations of the original semiconductor layers 126B will have higher p-type impurity concentrations than the diffused p-type regions in the original semiconductor regions 126A and 126C, and possibly the bottom portions of semiconductor regions 128. Also, from the original semiconductor layers 126B to the boundaries of the diffused p-type regions in regions 126A, 126C, and/or 128, the p-type doping concentration may be increasingly and gradually reduced.

Figure 22B:
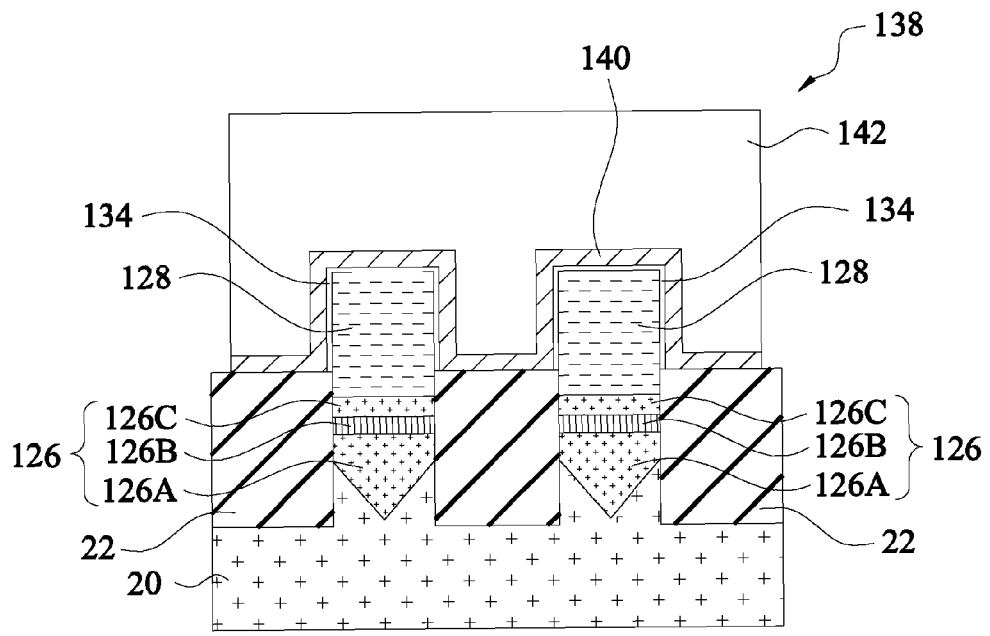
FIG. 22B illustrates a cross-sectional view of a FinFET in accordance with alternative embodiments.

FIG. 22B illustrates a cross-sectional view of FinFET 138 in accordance with alternative embodiments. These embodiments are essentially the same as the embodiments in FIG. 22A, except that the semiconductor regions 128 are not thinned.

Figure 22C:
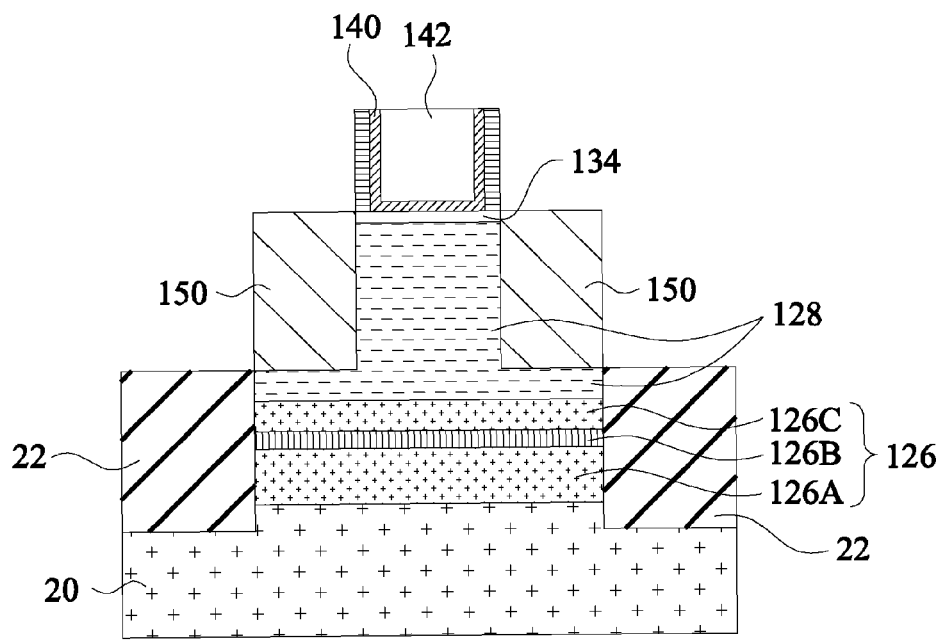
FIG. 22C illustrates another cross-sectional view of a FinFET in accordance with some embodiments.

FIG. 22C illustrates a cross-sectional view of FinFET 138, wherein the cross-sectional view is obtained from the plane crossing line 22C-22C in FIG. 22A. Source and drain regions 150 are formed on the opposite sides of gate dielectric 140 and gate electrode 142, and are connected to semiconductor regions 128. Source and drain regions 150 are doped with a p-type impurity such as boron, indium, or the like, and hence the respective FinFET 138 is a p-type FinFET.

Figure 23:
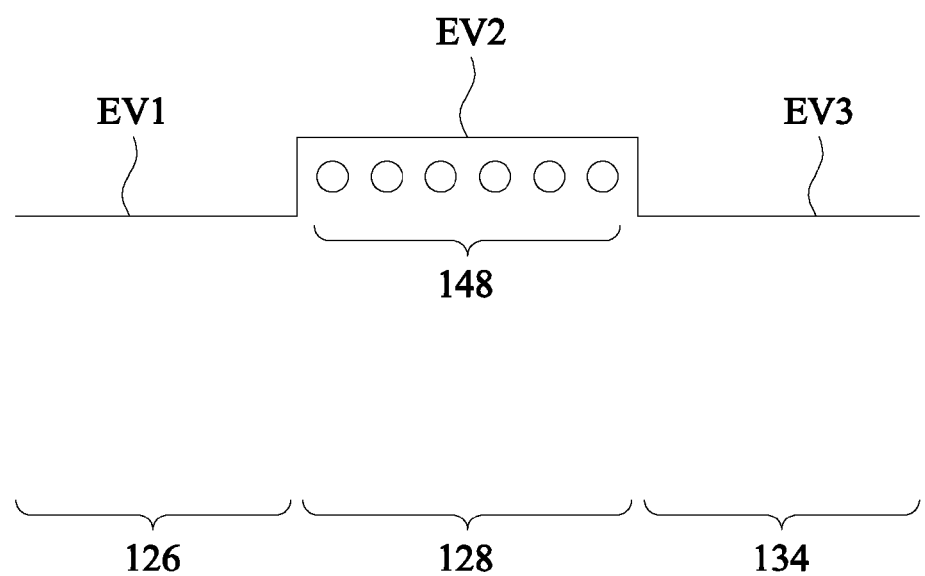
FIG. 23 illustrates a band diagram of a plurality of semiconductor regions in a p-type FinFET.

FIG. 23 schematically illustrates the valence band Ev1 of semiconductor buffers 126, the valence band Ev2 of semiconductor regions 128, and the valence band Ev3 of semiconductor caps 134. Valence bands Ev1 of semiconductor buffers 126 and valence band Ev3 of semiconductor caps 134 are lower than valence band Ev2 of semiconductor regions 128. Accordingly, valence bands Ev1, Ev2, and Ev3 form a well, with valence band Ev2 forming the bottom of the well. Holes 148, which are supplied by semiconductor layers 126B (FIGS. 22A, 22B, and 22C), are confined in the well, so that the mobility of the carriers in the channels is improved.

The above-discussed embodiments of the present disclosure have some advantageous features. In the above-discussed embodiments of the present disclosure, by forming relaxed semiconductor buffers 126 that have a smaller lattice constant than the lattice constant of semiconductor region 128, the overlying semiconductor region 128 may have a compressive strain. Furthermore, by forming semiconductor region 128 having a valence band higher than the valence band of the overlying semiconductor caps and underlying semiconductor buffers, quantum wells may be formed, allowing holes to have an increased mobility.

In accordance with some embodiments of the present disclosure, a device includes a substrate, insulation regions extending into the substrate, a first semiconductor region between the insulation regions and having a first valence band, and a second semiconductor region over and adjoining the first semiconductor region. The second semiconductor region has a compressive strain and a second valence band higher than the first valence band. The second semiconductor region includes an upper portion higher than top surfaces of the insulation regions to form a semiconductor fin, and a lower portion lower than the top surfaces of the insulation regions. The upper portion and the lower portion are intrinsic. A semiconductor cap adjoins a top surface and sidewalls of the semiconductor fin. The semiconductor cap has a third valence band lower than the second valence band.

In accordance with alternative embodiments of the present disclosure, a device includes a silicon substrate, insulation regions extending into the silicon substrate, a first silicon germanium region between the insulation regions and having a first germanium percentage, and a second silicon germanium region over and adjoining the first silicon germanium region. The second silicon germanium region has a second germanium percentage higher than the first germanium percentage. The second silicon germanium region includes a lower portion having a top surface level with top surfaces of the insulation regions, wherein the lower portion is intrinsic, and an upper portion higher than the top surfaces of the insulation regions. A silicon-containing cap adjoins a top surface and sidewalls of the upper portion of the second silicon germanium region. The silicon-containing cap has a third germanium percentage lower than the second germanium percentage.

In accordance with yet alternative embodiments of the present disclosure, a method includes recessing a portion of a substrate between two insulation regions to form a recess, and performing a first epitaxy to grow a first semiconductor region in the recess, wherein a top portion of the first semiconductor region is relaxed. The first epitaxy includes a first stage for growing a first portion, wherein the first portion is intrinsic, a second stage for growing a second portion over the first portion, wherein the second portion is doped with a p-type impurity, and a third stage for growing a third portion over the second portion, wherein the third portion is intrinsic. The method further includes performing a second epitaxy to grow a second semiconductor region in the recess. The second semiconductor region is over and contacting the first semiconductor region, and the second semiconductor region has a compressive strain. A planarization is performed to level top surfaces of the second semiconductor region and the insulation regions. The insulation regions are recessed, wherein a top portion of the second semiconductor region over the insulation regions forms a semiconductor fin. A third epitaxy is performed to grow a semiconductor cap contacting a top surface and sidewalls of the semiconductor fin. The semiconductor cap and the first semiconductor region have valence bands higher than a valence band of the second semiconductor region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate;
   insulation regions extending into the substrate;
   a first semiconductor region between the insulation regions and having a first valence band;
   a second semiconductor region over and adjoining the first semiconductor region, wherein the second semiconductor region has a compressive strain and a second valence band higher than the first valence band, and wherein the second semiconductor region comprises:
   an upper portion higher than top surfaces of the insulation regions to form a semiconductor fin; and
   a lower portion lower than the top surfaces of the insulation regions, wherein the upper portion and the lower portion are intrinsic, and the upper portion is narrower than the lower portion; and
a semiconductor cap adjoining a top surface and sidewalls of the semiconductor fin, wherein the semiconductor cap has a third valence band lower than the second valence band.

2. The device of claim 1, wherein the semiconductor cap is intrinsic.

3. The device of claim 1, wherein the first semiconductor region is doped with a p-type impurity.

4. The device of claim 3, wherein an intermediate level of the first semiconductor region has a highest p-type impurity concentration, and wherein from an interface between the first semiconductor region and the second semiconductor region to the intermediate level, p-type impurity concentrations increase gradually.

5. The device of claim 1, wherein the lower portion of the second semiconductor region has a height in a range between about 30 nm and about 50 nm.

6. The device of claim 1 further comprising:
a gate dielectric over and in contact with the semiconductor cap;
a gate electrode over the gate dielectric; and
a source/drain region connected to the upper portion of the second semiconductor region.

7. A device comprising:
a silicon substrate;
insulation regions extending into the silicon substrate;
a first silicon germanium region between the insulation regions and having a first germanium percentage;
a second silicon germanium region over and adjoining the first silicon germanium region, wherein the second silicon germanium region has a second germanium percentage higher than the first germanium percentage, and wherein the second silicon germanium region comprises:
a lower portion comprising a top surface level with top surfaces of the insulation regions, wherein the lower portion is intrinsic; and
an upper portion higher than the top surfaces of the insulation regions; and
a silicon-containing cap adjoining a top surface and sidewalls of the upper portion of the second silicon germanium region, wherein the silicon-containing cap has a third germanium percentage lower than the second germanium percentage.

8. The device of claim 7, wherein a top portion of the first silicon germanium region is relaxed.

9. The device of claim 7, wherein the upper portion of the second silicon germanium region is intrinsic.

10. The device of claim 7, wherein the silicon-containing cap is free from germanium, and is intrinsic.

11. The device of claim 7, wherein the silicon-containing cap comprises silicon germanium, and is intrinsic.

12. The device of claim 7, wherein a top portion of the first silicon germanium region is doped with a p-type impurity, and a lower portion of the first silicon germanium region is intrinsic.

13. The device of claim 7 further comprising:
a gate dielectric over and in contact with the silicon-containing cap;
a gate electrode over the gate dielectric; and
a source/drain region connected to the upper portion of the second silicon germanium region.

14. The device of claim 7, wherein the lower portion of the second silicon germanium region comprises first edges contacting edges of the insulation regions, and wherein the upper portion of the second silicon germanium region comprises second edges discontinued from the first edges.

15. A method comprising:
recessing a portion of a substrate between two insulation regions to form a recess;
performing a first epitaxy to grow a first semiconductor region in the recess, wherein a top portion of the first semiconductor region is relaxed, and the first epitaxy comprises:
a first stage for growing a first portion, wherein the first portion is intrinsic;
a second stage for growing a second portion over the first portion, wherein the second portion is doped with a p-type impurity; and
a third stage for growing a third portion over the second portion, wherein the third portion is intrinsic;
performing a second epitaxy to grow a second semiconductor region in the recess, wherein the second semiconductor region is over and contacting the first semiconductor region, and the second semiconductor region has a compressive strain;
performing a planarization to level top surfaces of the second semiconductor region and the insulation regions;
recessing the insulation regions, wherein a top portion of the second semiconductor region over the insulation regions forms a semiconductor fin; and
performing a third epitaxy to grow a semiconductor cap contacting a top surface and sidewalls of the semiconductor fin, wherein the semiconductor cap and the first semiconductor region have valence bands higher than a valence band of the second semiconductor region.

16. The method of claim 15 further comprising thinning the semiconductor fin before the third epitaxy.

17. The method of claim 15, wherein the second semiconductor region is not doped with p-type and n-type impurities.

18. The method of claim 15, wherein the semiconductor cap is not doped with p-type and n-type impurities.

19. The method of claim 15 further comprising:
forming a gate dielectric over the semiconductor cap;
forming a gate electrode over the gate dielectric; and
forming a source region and a drain region on opposite sides of the semiconductor cap.

20. The device of claim 7, wherein the upper portion is narrower than the lower portion.

* * * * *